(12) United States Patent
Matsuo et al.

(10) Patent No.: US 7,053,721 B2
(45) Date of Patent: May 30, 2006

(54) OSCILLATOR HAVING A RESONANT CIRCUIT AND A DRIVE CIRCUIT

(75) Inventors: Nobuaki Matsuo, Yokohama (JP); Alejandro Puel, San Jose, CA (US)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/717,895

(22) Filed: Nov. 21, 2003

(65) Prior Publication Data

US 2005/0110584 A1    May 26, 2005

(51) Int. Cl.
*H03B 1/00*   (2006.01)
*H03B 5/12*   (2006.01)
*H03B 5/18*   (2006.01)

(52) U.S. Cl. .................. 331/117 R; 331/74; 331/75; 331/96; 331/117 D; 331/177 V

(58) Field of Classification Search .............. 331/36 C, 331/74–77, 96, 117 R, 117 FE, 117 D, 171, 331/177 V See application file for complete search history.

(56) References Cited

U.S. PATENT DOCUMENTS

| | | | | |
|---|---|---|---|---|
| 3,230,396 A | * | 1/1966 | Boelke | 327/122 |
| 5,185,583 A | * | 2/1993 | Ooi et al. | 331/15 |
| 5,418,500 A | * | 5/1995 | Igarashi | 331/76 |
| 5,625,327 A | * | 4/1997 | Carroll et al. | 331/74 |
| 5,945,884 A | * | 8/1999 | Nakatsuka | 331/117 R |

FOREIGN PATENT DOCUMENTS

| | | |
|---|---|---|
| JP | 63-209306 | 8/1988 |
| JP | 64-5513 | 1/1989 |
| JP | 2003-163538 | 6/2003 |

* cited by examiner

*Primary Examiner*—David Mis
(74) *Attorney, Agent, or Firm*—Arent Fox PLLC

(57) ABSTRACT

An oscillator includes a resonant circuit generating a resonant signal, a drive circuit that feeds back the resonant signal to the resonant circuit, and an output terminal connected to a given node of the resonant circuit, an oscillation signal of the oscillator being output via the output terminal.

13 Claims, 5 Drawing Sheets

OSCILLATOR HAVING A RESONANT CIRCUIT AND A DRIVE CIRCUIT

BACKGROUND OF THE INVENTION

1. Field of the Invention

The present invention generally relates to oscillators, and more particularly, to an oscillator suitable for radio-frequency (RF) circuits.

2. Description of the Related Art

Conventionally, various types of oscillators such as a local oscillator for FM tuners, a crystal oscillator, and a voltage-controlled oscillator are used. A Colpittz oscillator and a Hartley oscillator are known as LC oscillators. The LC oscillator employs a resonant circuit by the combination of an inductor L and a capacitor C. The LC resonant circuit is capable of generating an oscillation signal over a wide frequency range. Generally, a buffer circuit follows the LC oscillation circuit of the oscillator in order to stabilize oscillation.

Recently, there has been considerable activity in the development of downsized oscillator due to downsizing of electronic devices. However, the oscillator composed of the oscillation circuit and the buffer circuit has reached the limit of downsizing.

FIG. 1 is a circuit diagram of a conventional Colpittz oscillation circuit. The Colpittz oscillator circuit is made up of a transistor TR, capacitors C1 and C2, resistors R1, R2 and R3 and an inductor L. A power supply voltage is applied to the oscillator via a terminal P1. A series circuit of the resistors R1 and R2 is connected between the terminal P1 and ground, and generates a DC bias voltage, which is applied to the base of the transistor TR. The emitter is biased by the resistor R3 that serves as an emitter bias resistor. A buffer circuit (not shown) follows the Colpittz oscillation circuit. More particularly, the buffer circuit is connected to the emitter of the transistor TR.

However, the conventional oscillator composed of the oscillation circuit and the buffer circuit has a disadvantage in that the oscillation signal is not extracted efficiently.

SUMMARY OF THE INVENTION

It is a general object of the present invention to provide an oscillator capable of outputting an oscillation signal efficiently.

This object of the present invention is achieved by an oscillator comprising: a resonant circuit generating a resonant signal; a drive circuit that feeds back the resonant signal to the resonant circuit; and an output terminal connected to a given node of the resonant circuit, an oscillation signal of the oscillator being output via the output terminal.

BRIEF DESCRIPTION OF THE DRAWINGS

Other objects, features and advantages of the present invention will become more apparent from the following detailed description when read in conjunction with the accompanying drawings, in which like reference numerals refer to like elements throughout, wherein.

DESCRIPTION OF THE PREFERRED EMBODIMENTS

A description will now be given of embodiments of the invention.

First Embodiment

Figure 1:
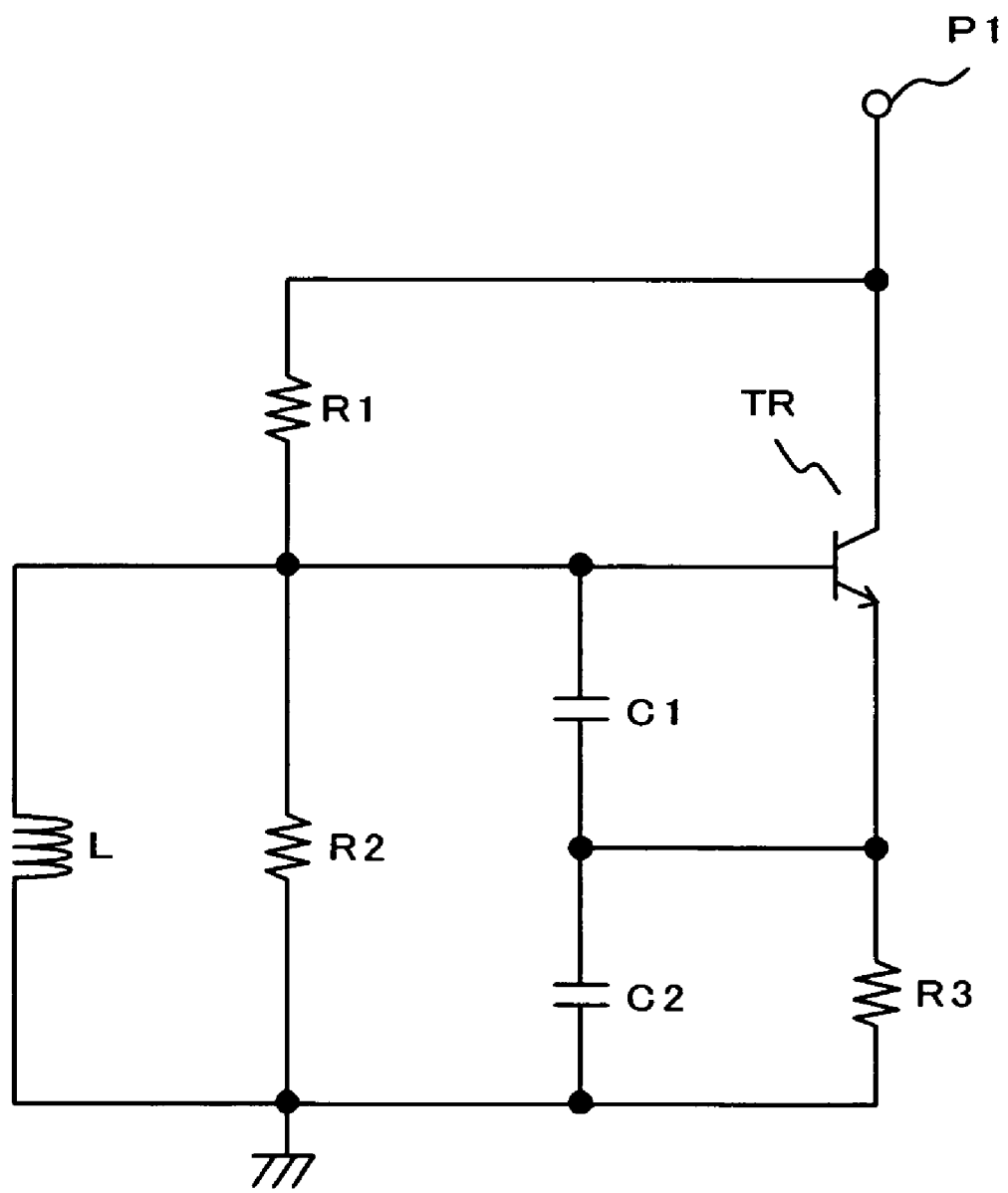
FIG. 1 is a circuit diagram of a conventional Colpittz oscillator.
Figure 2:
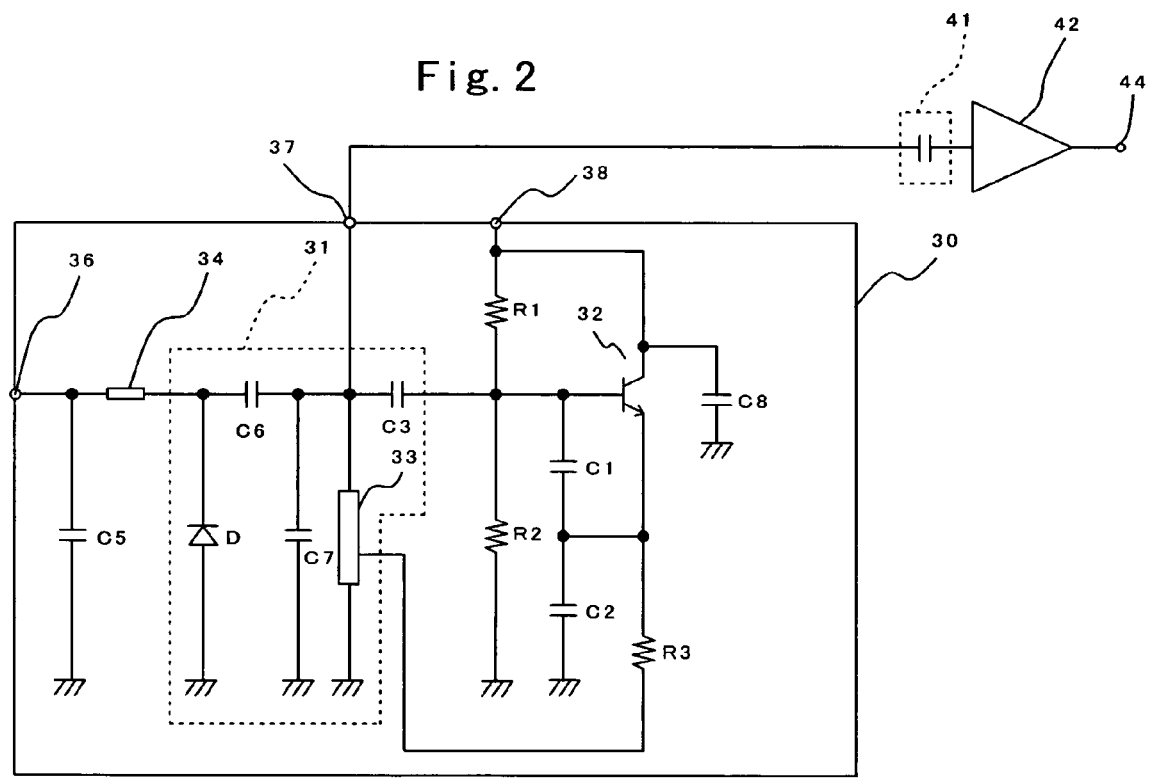
FIG. 2 is a circuit diagram of an oscillator according to a first embodiment of the present invention.

FIG. 2 is a circuit diagram of an oscillator according to a first embodiment of the present invention. The oscillator includes an oscillation circuit 30, a matching circuit 41 and a buffer circuit 42. The oscillation circuit 30 generates an oscillation signal, which is applied to an output terminal 44 via the matching circuit 41 and the buffer circuit 42.

The oscillation circuit 30 includes a resonant circuit 31 and a drive circuit having an oscillation transistor 32. The resonant circuit 31 generates a resonant signal. The oscillation transistor 32 feeds the resonant signal back to the resonant circuit 31 to drive the resonant circuit 32. The resonant circuit 31 is an LC resonant circuit. More particularly, the resonant circuit 31 is made up of a diode D, capacitors C3, C6 and C7 and an inductor 33. The diode D may be a variable capacitance diode. A control signal is externally applied to the cathode of the diode D via the control terminal 36 and an inductor 34, which is a choke coil. The anode of the diode D is grounded. The control signal changes the capacitance of the diode D[1], this changing the resonant frequency of the resonator 31. An AC component applied to the control terminal 36 flows to ground via a bypass capacitor C5. The cathode of the diode D is grounded via the capacitors C6 and C7. One end of the inductor 33 is coupled to the cathode of the diode D via the capacitor C6, and the other end of the inductor 33 is grounded. The inductor 33 is connected in parallel with the capacitor C7. The resonant frequency mainly depends on the diode D, the capacitors C6 and C7 and the inductor 33. The capacitor C3, which is connected between the inductor 33 and the base of the transistor 32, is provided for impedance adjustment.

A node, at which the inductor 33 and the capacitors C3, C6 and C7 are connected, is connected to an output terminal 37 of the oscillation circuit 30. The resonant signal available at the inductor 33 is relatively large. Thus, according to the present embodiment, the resonant signal available at the inductor 33 is used as the output signal of the oscillation circuit 30. The oscillation signal is applied to the output terminal 44 of the oscillator according to the matching circuit 41 and the buffer circuit 42. The matching circuit 41 functions to DC-isolate the oscillation circuit 30 from the buffer circuit 42. When the oscillation signal has frequencies as high as a few GHz, it is preferable to employ the matching circuit 41. The buffer circuit 42 amplifies the oscillation signal. An impedance adjustment circuit may follow the buffer circuit 42. The impedance adjustment circuit establishes the impedance matching between the oscillator and an external circuit connected to the output terminal 44.

The base voltage is defined by the resistors R1 and R2 connected in series between a power supply terminal 38 and ground. A power supply voltage is applied to the power supply terminal 38. The Colpittz oscillator includes the transistor 32, and the capacitors C1 and C2. The capacitor C1 is connected between the base and the emitter of the transistor 32. The capacitor C2 is connected between the emitter of the transistor 32 and ground. The emitter bias voltage is generated by the emitter bias resistor R3. One end of the resistor R3 is connected to the emitter of the transistor 32, and the other end thereof is connected to an intermediate node of the inductor 33. The emitter of the transistor 32 is grounded via the resistor R3 and part of the inductor 33. A bypass capacitor C8 is connected to the collector of the transistor 32 and ground. The collector of the transistor 32 is connected to the power supply terminal 38.

In operation, the resonant signal generated by the resonant circuit 31 is applied to the base of the transistor 32. The emitter output is then fed back to the resonant circuit 31 via the resistor R3. The oscillation signal, which can be by the control signal applied to the control terminal 36, is output via the output terminal 37.

The parts of the oscillator shown in FIG. 2 may be mounted on a common substrate or chip, which may be packaged. This structure will be described in detail later. Since the resonant signal has a relatively large level, it can be extracted as the oscillation signal, which is then amplified by the buffer 42. The buffer 42 may be omitted if the resonant signal is large enough to form the oscillation signal.

Second Embodiment

Figure 3:
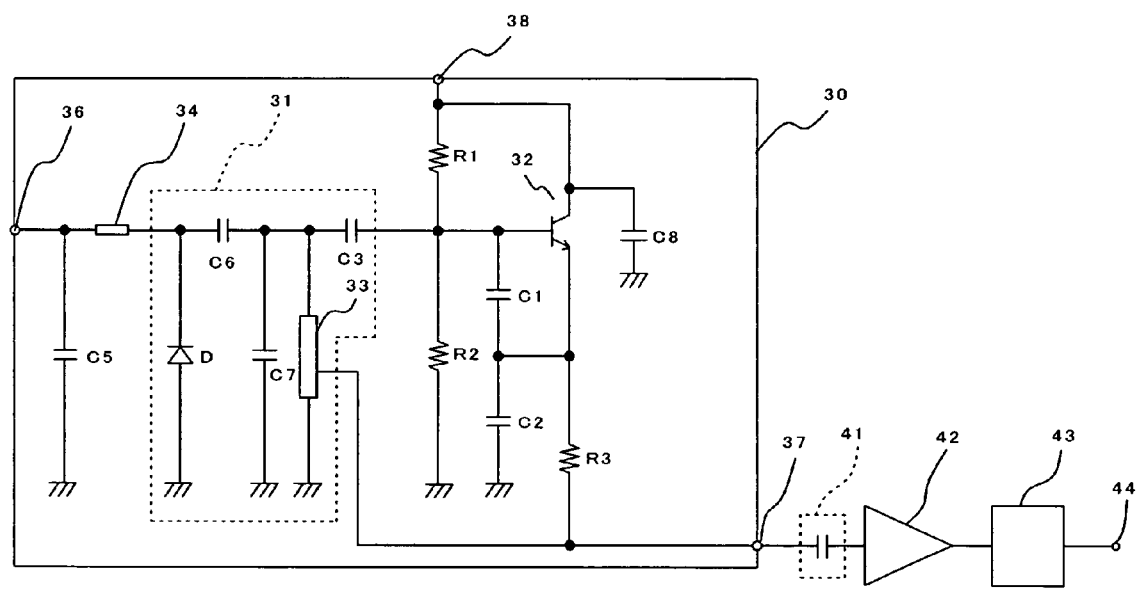
FIG. 3 is a circuit diagram of an oscillator according to a second embodiment of the present invention.

FIG. 3 is a circuit diagram of an oscillator according to a second embodiment of the present invention.

The oscillation signal generated by the oscillator 31 is extracted from the intermediate node of the inductor 33 to which one end of the emitter bias resistor R3 is connected. The intermediate node of the inductor 33 is connected to the output terminal 37 to which the matching circuit 41 is connected. As has been described previously, the resonant signal available at the inductor 33 is relatively large, even at the intermediate node. It is therefore possible to output the oscillation signal efficiently.

Figure 4:
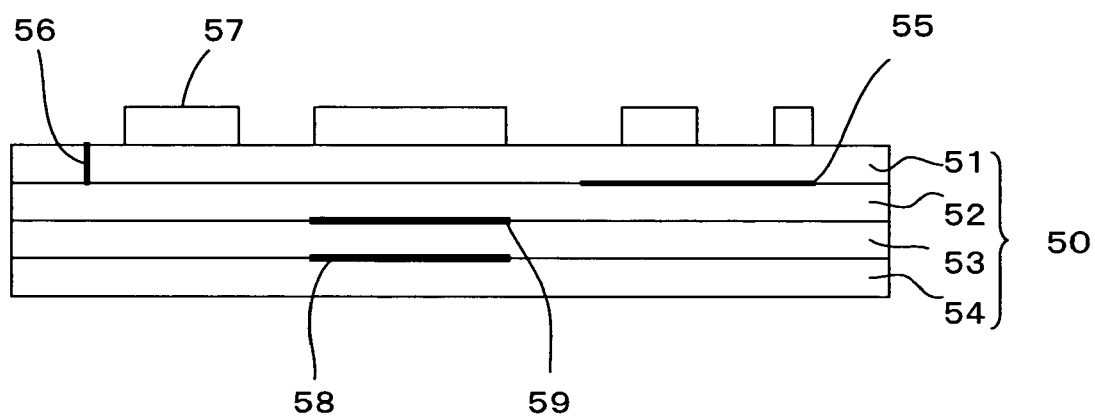
FIG. 4 schematically shows a cross section of a substrate used to realize the oscillator shown in FIGS. 2 and 3.

The oscillators of the first and second embodiments may be formed on a single substrate. FIG. 4 schematically shows a cross section of a substrate 50. The substrate 50 is a multi-layer substrate composed of layers 51–54 made of, for example, a ceramic material. Electronic parts 57 of the oscillator and pads for external connections are mounted on the top of the multilayer substrate 50. For example, the parts 57 are the transistor 32, capacitors C1–C3, C5, C6, C8 and the buffer circuit 42. A via hole 56 may be provided in any of the layers 51–54. A conductive pattern 55 may be provided at any interface between the adjacent layers. Preferably, the capacitor of the matching circuit 41 shown in FIGS. 2 and 3 may be incorporated in the multilayer substrate 50. In FIG. 4, two conductive patterns 58 and 59 face each other via the layer 53 and form the capacitor of the matching circuit 41.

A dielectric material may be additionally interposed between the conductive patterns 58 and 59. Alternatively, the layer sandwiched between the patterns 58 and 59 may be made of a dielectric material. It is not required that the conductive patterns 58 and 59 are dedicated to the capacitor 41, and may be parts of conductive patterns for making interconnections between parts. The capacitor 41 may also be formed by a pad on the top of the substrate 50 and a conductive pattern provided at the interface between the layers 51 and 52. The above pad on the top may be the output terminal 37. The capacitor 58 and 59 thus formed contribute to downsizing of the oscillator because there is no need to define an area on the top of the substrate 50 for mounting the capacitor of the matching circuit 41. Also, the capacitor 41 may be formed by a circuit pattern formed on the substrate 50 although an area for mounting is needed on the substrate surface.

Figure 5:
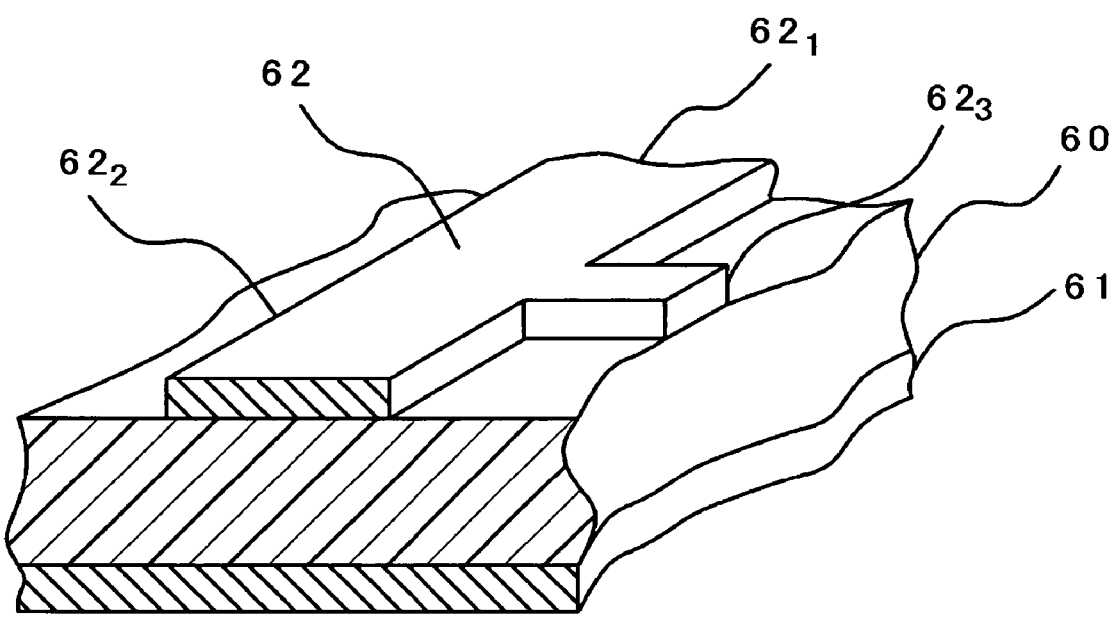
FIG. 5 schematically shows a micro stripline that forms an inductor employed in a resonant circuit of the first and second embodiments of the present invention.

FIG. 5 shows an example of the inductor 33 provided in the resonant circuit 31. The inductor 33 shown in FIG. 5 is formed by a transmission line. More particularly, the inductor 33 shown in FIG. 5 has a micro stripline, which has a substrate 60, a conductive pattern 62 formed on the front surface of the substrate 60, and a ground pattern 61 provided on the back surface thereof. A portion $62_2$ of the conductive pattern 62 is grounded, and a portion $62_1$, is connected to the capacitors C3, C6 and C7. A portion $62_3$ of the pattern 62 is connected to the emitter bias resistor R3. The inductance value of the inductor 33 may be adjusted by trimming the conductive pattern 62. The transmission line shown in FIG. 5 may be provided on the top of the substrate 50 or may be incorporated therein. In the latter case, the substrate 60 may be a part of the substrate 50. Another type of micro stripline, for example, a triplate micro stripline may be formed within the multilayer substrate 50.

The resonant circuit 31 is not limited to the circuit configuration shown in FIG. 2. For example, the resonant circuit 31 may include a resonator formed by crystal or the like.

The present invention is not limited to the specifically disclosed embodiments, and other embodiments, variations and modifications may be made without departing from the scope of the present invention.

What is claimed is:

1. An oscillator comprising:
a resonant circuit generating a resonant signal and including an inductor;
a drive circuit that feeds back the resonant signal to the resonant circuit via a first node of the inductor and receives a DC voltage; and
an output terminal connected to a second node of the inductor, an oscillation signal of the oscillator being output via the output terminal,
the inductor being isolated from the DC voltage.

2. The oscillator as claimed in claim 1, wherein the first node is an intermediate node of the inductor, and the second node is an end of the inductor.

3. The oscillator as claimed in claim 1, wherein the first node and the second node are an identical node that is an intermediate node of the inductor.

4. The oscillator as claimed in claim 1, further comprising a matching circuit including a capacitor connected to the second node of the inductor via the output terminal of the oscillator.

5. The oscillator as claimed in claim 1, wherein
the drive circuit comprises a transistor having a base that receives the resonant signal, a collector receiving a power supply voltage, and an emitter connected to the first terminal of the inductor of the resonant circuit.

6. The oscillator as claimed in claim 1, wherein:
the resonant circuit includes an inductor;
the drive circuit comprises a transistor having a base that receives the resonant signal, a collector receiving a power supply voltage, and an emitter coupled to the first terminal of the inductor of the resonant circuit via an emitter bias resistor.

7. The oscillator as claimed in claim 1, wherein:
the resonant circuit includes an inductor;
the drive circuit comprises a transistor having a base that receives the resonant signal, a collector receiving a power supply voltage, and an emitter coupled to the first terminal of the inductor of the resonant circuit; and the oscillator further comprises a matching circuit having a capacitor coupled to the emitter of the drive circuit.

8. The oscillator as claimed in claim 1, wherein:

the resonant circuit includes an inductor;

the drive circuit comprises a transistor having a base that receives the resonant signal, a collector receiving a power supply voltage, and an emitter coupled to the first terminal of the inductor of the resonant circuit; and the oscillator further comprises a matching circuit having a capacitor coupled to the inductor via the output terminal.

9. The oscillator as claimed in claim 1, wherein the resonant circuit includes an inductor formed by a transmission line.

10. The oscillator as claimed in claim 1, wherein the resonant circuit includes an inductor formed by a micro stripline.

11. The oscillator as claimed in claim 1, wherein the resonant circuit includes a variable capacitance diode that receives a control signal via a control terminal of the oscillator, so that an oscillation frequency can be adjusted externally.

12. An oscillator comprising:

a resonant circuit generating a resonant signal;

a drive circuit that feeds back the resonant signal to the resonant circuit;

an output terminal connected to a given node of the resonant circuit, an oscillation signal of the oscillator being output via the output terminal;

a matching circuit including a capacitor connected to the resonant circuit via the output terminal of the oscillator; and a substrate on which the resonant circuit and the drive circuit are formed, the capacitor of the matching circuit including a conductive pattern provided to the substrate.

13. An oscillator comprising:

a resonant circuit generating a resonant signal;

a drive circuit that feeds back the resonant signal to the resonant circuit;

an output terminal connected to a given node of the resonant circuit, an oscillation signal of the oscillator being outDut via the outDut terminal;

a matching circuit including a capacitor connected to the resonant circuit via the output terminal of the oscillator; and a substrate on which the resonant circuit and the drive circuit are formed, the capacitor of the matching circuit including conductive patterns that are provided to the substrate and face each other.

* * * * *